(12) United States Patent
Lee

(10) Patent No.: US 7,442,653 B2
(45) Date of Patent: Oct. 28, 2008

(54) INTER-METAL DIELECTRIC OF SEMICONDUCTOR DEVICE AND MANUFACTURING METHOD THEREOF INCLUDING PLASMA TREATING A PLASMA ENHANCED FLUOROSILICATE GLASS

(75) Inventor: Tae-Young Lee, Seongnam (KR)

(73) Assignee: Dongbu Electronics Co., Ltd., Seoul (KR)

( * ) Notice: Subject to any disclaimer, the term of this patent is extended or adjusted under 35 U.S.C. 154(b) by 84 days.

(21) Appl. No.: 11/316,634

(22) Filed: Dec. 20, 2005

(65) Prior Publication Data

US 2006/0141785 A1    Jun. 29, 2006

(30) Foreign Application Priority Data

Dec. 23, 2004    (KR) .................... 10-2004-0111041

(51) Int. Cl.
*H01L 21/31* (2006.01)
(52) U.S. Cl. .................. 438/761; 438/758; 438/775; 438/791; 257/687; 257/789; 257/791; 257/E23.077; 257/E23.132
(58) Field of Classification Search ............. 438/98, 438/100, 637, 638, 639, 640, 758, 761, 775, 438/791, 798, 978; 257/626, 632, E23.077, 257/E23.132, E23.134
See application file for complete search history.

(56) References Cited

U.S. PATENT DOCUMENTS

| 6,136,680 A * | 10/2000 | Lai et al. ..................... 438/597 |
| 6,284,644 B1 * | 9/2001 | Aug et al. .................... 438/623 |
| 6,335,274 B1 * | 1/2002 | Wu et al. ..................... 438/626 |
| 7,186,640 B2 * | 3/2007 | Huang et al. ................. 438/622 |
| 2004/0048468 A1 * | 3/2004 | Liu et al. ..................... 438/687 |

* cited by examiner

*Primary Examiner*—W. David Coleman
*Assistant Examiner*—Su C Kim
(74) *Attorney, Agent, or Firm*—Andrew D. Fortney

(57) ABSTRACT

An exemplary manufacturing method of an inter-metal dielectric of a semiconductor device according to an embodiment of the present invention includes forming a first silicon-rich oxide (SRO) layer on a silicon substrate provided with or otherwise having a copper line layer therein, forming a plasma enhanced fluorosilicate glass (PEFSG) layer on the first SRO layer, plasma-treating the PEFSG layer, and forming a second SRO layer on the plasma-treated PEFSG layer. According to the present invention, the thickness of the second SRO layer of the inter-metal dielectric can be reduced. Consequently, process cost can be reduced, and the total thickness of the inter-metal dielectric can be reduced so as to lower the dielectric constant thereof, reduce the aspect ratio of any via holes that are subsequently formed in the inter-metal dielectric, and potentially increase the yield as a result of the reduced via hole aspect ratio.

15 Claims, 3 Drawing Sheets

INTER-METAL DIELECTRIC OF SEMICONDUCTOR DEVICE AND MANUFACTURING METHOD THEREOF INCLUDING PLASMA TREATING A PLASMA ENHANCED FLUOROSILICATE GLASS

CROSS-REFERENCE TO RELATED APPLICATION

This application claims priority to and the benefit of Korean Patent Application No. 10-2004-0111041, filed in the Korean Intellectual Property Office on Dec. 23, 2004, the entire contents of which are incorporated herein by reference.

BACKGROUND OF THE INVENTION (a) Field of the Invention

The present invention relates to a dielectric in a semiconductor device and a manufacturing method thereof. More particularly, the present invention relates to an inter-metal dielectric of a semiconductor device using a copper damascene process and a manufacturing method thereof.

(b) Description of the Related Art

Materials having low dielectric constants have been generally used as inter-metal dielectrics for aluminum and copper damascene metallization in semiconductor devices, so that the RC delay time of the devices can be reduced, and the performance of the devices can be enhanced. Fluorosilicate glass (FSG) having a dielectric constant of 3.4-3.7 is one of the materials that are commonly used as an interlayer insulation layer.

In a conventional method using FSG, the high mobility of the fluorine ions therein and the moisture-absorbing characteristic thereof may generate hydrofluoric acid (HF) at the interface between the FSG layer and a copper line layer. The hydrofluoric acid (HF) may cause corrosion of the copper line layer or adhesion failure thereof. The adhesion failure between the FSG layer and a copper line layer may cause peeling or delamination of the copper line layer.

The above information disclosed in this Background section is only for enhancement of understanding of the background of the invention, and therefore, it may contain information that does not form prior art or other information that is already known in this or any other country to a person of ordinary skill in the art.

SUMMARY OF THE INVENTION

The present invention has been made in an effort to provide an inter-metal dielectric of a semiconductor device and a manufacturing method thereof, having advantages of preventing peeling or delamination of a copper line layer on a fluorosilicate glass (FSG) layer.

An exemplary manufacturing method of such an inter-metal dielectric according to an embodiment of the present invention includes forming a first oxide layer (e.g., a silicon-rich oxide, or SRO) on a silicon substrate having a copper line layer therein, forming a plasma enhanced fluorosilicate glass (PEFSG) layer on the first SRO layer, plasma-treating the PEFSG layer, and forming a second SRO layer on the plasma-treated PEFSG layer.

Before forming the first silicon-rich oxide (SRO) layer, the method may further comprise forming a silicon nitride layer, which may be an etch-stop layer or provide an etch-stop function.

In a further embodiment, plasma-treating the PEFSG layer may comprise sequentially treating the PEFSG layer with an oxygen plasma and a nitrogen oxide plasma. The first SRO layer may have a thickness of 300-500 Å, and the PEFSG layer may have a thickness of 3000-6000 Å. The second SRO layer may have a thickness of 1000-2000 Å.

An exemplary inter-metal dielectric of a semiconductor device according to another embodiment of the present invention includes a first SRO layer on a silicon substrate having a copper line layer therein, a PEFSG layer on the first SRO layer, a passivation layer on the surface of the PEFSG layer, and a second SRO layer on the passivation layer.

In a further embodiment, a silicon nitride layer may be under the first SRO layer.

The thickness of the first SRO layer may be 300-500 Å, the thickness of the PEFSG layer may be 3000-6000 Å, and the thickness of the second SRO layer may be 1000-2000 Å.

In the present invention, a passivation layer is formed on the PEFSG layer by plasma treatment, so the peeling or delamination of the copper line layer caused by out-gassing of fluorine (F) having high mobility can be suppressed.

DETAILED DESCRIPTION OF THE EMBODIMENTS

An exemplary embodiment of the present invention will hereinafter be described in detail with reference to the accompanying drawings.

Figure 1:
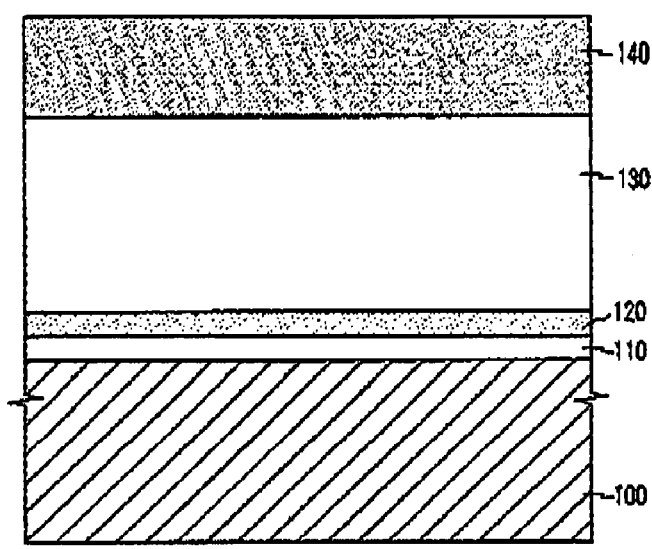
FIG. 1 is a cross-sectional view showing a conventional inter-metal dielectric of semiconductor device.

FIG. 1 is a cross-sectional view showing a conventional inter-metal dielectric of a semiconductor device.

An inter-metal dielectric for a copper damascene process includes a silicon substrate 100 provided with a copper line layer therein (not shown, but generally, a conventional single or dual damascene copper metallization layer), a silicon nitride layer 110 (e.g., an etch-stop layer) thereon, a fluorosilicate glass (FSG) layer 130 having a low dielectric constant, and a pair of silicon rich oxide (SRO) layers 120 and 140 configured to prevent fluorine-outgassing from FSG layer 110. Silicon rich oxide (SRO) layers 120 and 140 are respectively formed beneath and above the FSG layer 130. The upper SRO layer 140 may have a thickness of 2000-3000 Å, so the total dielectric constant of the inter-metal dielectric may be enhanced. Therefore, the present invention concerns a new inter-metal dielectric layer that can suppress the fluorine-outgassing of the FSG layer 130 and have a lower dielectric constant by reducing the thickness of the upper SRO layer 140.

Figure 2:
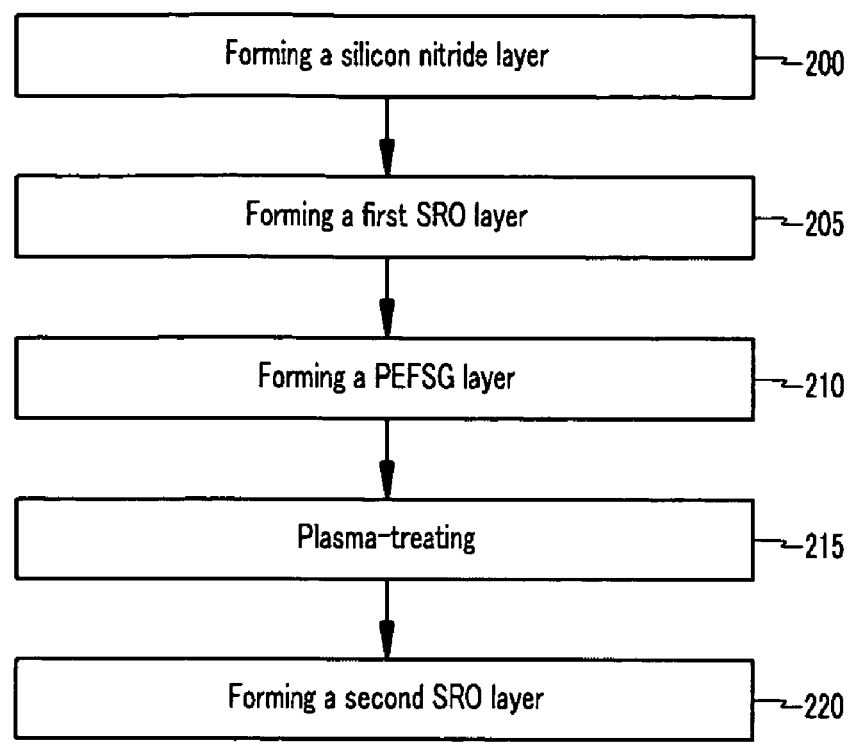
FIG. 2 is a flowchart showing an exemplary manufacturing method of an inter-metal dielectric of a semiconductor device according to an embodiment of the present invention.
Figure 3:
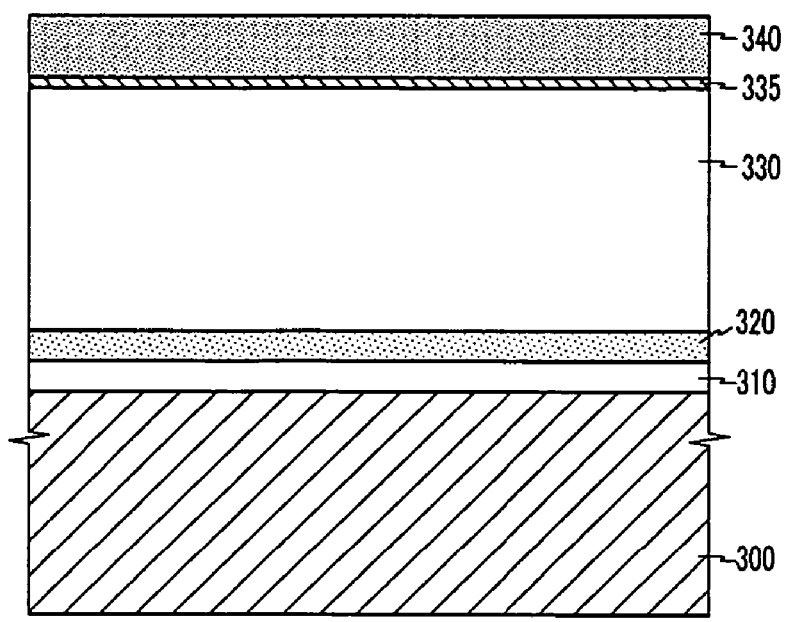
FIG. 3 is a cross-sectional view showing an exemplary inter-metal dielectric of a semiconductor device according to another embodiment of the present invention.

FIG. 2 is a flowchart showing an exemplary method of manufacturing an inter-metal dielectric in a semiconductor device according to an embodiment of the present invention, and FIG. 3 is a cross-sectional view showing an exemplary inter-metal dielectric of a semiconductor device according to another embodiment of the present invention.

At step 200, a silicon nitride or other etch stop layer 310 is formed on a silicon substrate 300 having a copper line layer therein (not shown). The silicon nitride layer 310 may have an etch-stop function. The silicon nitride or other etch stop layer 310 may have a thickness of 500-700 Å.

At step 205, a first SRO layer 320 is formed on the silicon nitride layer 310. The first SRO layer 320 may suppress fluorine-outgassing from a subsequently-deposited FSG layer into underlying layers and/or structures. The first SRO layer 320 may have a thickness of 300-500 Å. Alternatively, first SRO layer 320 may be replaced with a conventional silicon dioxide layer (e.g., a silane- or TEOS-based oxide formed by PE-CVD or HDP-CVD).

At step 210, a plasma-enhanced FSG (PEFSG) layer 330 is formed on the first SRO layer 320. The PEFSG layer 330 may have a low dielectric constant. The PEFSG layer 330 may also have a thickness of 3000-6000 Å.

Subsequently, at step 215, the PEFSG layer 330 is plasma-treated, preferably with a first plasma containing an oxygen source (e.g., $O_2$ or $O_3$) and then with a second plasma containing source of nitrogen and oxygen (e.g., $N_2O$, NO, or $NO_2$). In even more preferred embodiments, the first plasma comprises or consists essentially of an oxygen ($O_2$) plasma, and the second plasma comprises or consists essentially of a nitrogen oxide ($N_2O$) plasma. The objective of the plasma treatment is to form a thin passivation layer 335 that can suppress the fluorine-outgassing at the upper surface of the PEFSG layer.

Particularly, the sequential treatment by an oxygen-containing plasma and then by a plasma containing nitrogen and oxygen sources is a more effective method than a single treatment by a nitrogen oxide plasma in acquiring an atomic (or other barrier) layer for suppressing the fluorine-outgassing.

At step 220, a second SRO layer 340 is formed on the passivation layer 335 of the PEFSG layer 330. The second SRO layer 340 may also suppress fluorine-outgassing. The second SRO layer 340 can have a thickness of 1000-2000 Å, which is generally thinner than that of previous technology.

As described above, in the present invention, a passivation layer 335 is formed on the PEFSG layer 330 by the plasma treatment thereof, so the peeling or delamination of the copper line layer caused by out-gassing of fluorine (F) can be suppressed.

According to the present invention, the thickness of the second SRO layer of the inter-metal dielectric can be reduced. Consequently, process costs can be reduced, and the total thickness of the inter-metal dielectric can be reduced so as to lower the dielectric constant thereof. Furthermore, the aspect ratio of any via holes that are subsequently formed in the inter-metal dielectric can be reduced, and potentially, the yield of a method of manufacturing semiconductor devices including the present method can be increased (e.g., as a result of the reduced via hole aspect ratio).

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a dielectric layer in a semiconductor device, comprising:

forming a first silicon-rich oxide (SRO) layer on a silicon substrate having a copper line layer therein;

forming a plasma enhanced fluorosilicate glass (PEFSG) layer on the first SRO layer;

forming a passivation layer which suppresses a fluorine-outgassing at an upper surface of the PEFSG layer by plasma-treating the PEFSG layer with a first plasma containing an oxygen source and subsequently with a second plasma containing a source of nitrogen and oxygen; and forming a second silicon-rich oxide (SRO) layer on the plasma-treated PEFSG layer.

2. The manufacturing method of claim 1, further comprising, before forming the first silicon rich oxide (SRO) layer, forming a silicon nitride layer.

3. The manufacturing method of claim 2, wherein the silicon nitride layer provides an etch-stop function.

4. The manufacturing meted of claim 1, wherein the first plasma comprises an oxygen ($O_2$) plasma.

5. The manufacturing method of claim 1, wherein the second plasma comprises a nitrogen oxide plasma.

6. The manufacturing method of claim 1, wherein plasma-treating the PEFSG layer comprises sequentially treating the PEFSG layer with an oxygen plasma and a nitrogen oxide plasma.

7. The manufacturing method of claim 1, wherein the first SRO layer has a thickness of 300-500 Å, and the PEFSG layer has a thickness of 3000-6000 Å.

8. The manufacturing method of claim 1, wherein the second SRO layer has a thickness of 1000-2000 Å.

9. The manufacturing method of claim 1, wherein the first SRO layer has a thickness of 300-500 Å, the PEFSG layer has a thickness of 3000-6000 Å, and the second SRO layer has a thickness of 1000-2000 Å.

10. A dielectric layer in a semiconductor device, comprising:

a first silicon-rich oxide (SRO) layer on a silicon substrate having a copper layer therein;

a plasma enhanced fluorosilicate glass (PEFSG) layer on the first SRO layer;

a passivation layer on the surface of the PEFSG layer to suppress a fluorine-outgassing at an upper surface of the PEFSG layer, wherein the passivation layer is formed by sequentially treating the PEFSG layer with a first plasma containing an oxygen source and a second plasma containing a source of nitrogen and oxygen; and a second SRO layer on the passivation layer.

11. The dielectric layer of claim 10, wherein the passivation layer comprises a plasma-treated surface of the PEFSG layer.

12. The dielectric layer of claim 10, further comprising a silicon nitride layer under the first SRO layer.

13. The dielectric layer of claim 10, wherein the first SRO layer has a thickness of 300-500 Å, and the PEFSG layer has a thickness of 3000-6000 Å.

14. The dielectric of claim 10, wherein the second SRO layer has a thickness of 1000-2000 Å.

15. The dielectric of claim 10, wherein the first SRO layer has a thickness of 300-500 Å, the PEFSG layer has a thickness of 3000-6000 Å, and the second SRO layer has a thickness of 1000-2000 Å.

* * * * *